(12) United States Patent
Croguennec et al.

(10) Patent No.: US 8,352,752 B2
(45) Date of Patent: Jan. 8, 2013

(54) DETECTING RADIATION-BASED ATTACKS

(75) Inventors: Alexandre Croguennec, Aix En Provence (FR); Yves Fusella, Aubagne (FR)

(73) Assignee: Inside Secure, Aix-en-Provence, Codex (FR)

( * ) Notice: Subject to any disclaimer, the term of this patent is extended or adjusted under 35 U.S.C. 154(b) by 0 days.

(21) Appl. No.: 11/515,103

(22) Filed: Sep. 1, 2006

(65) Prior Publication Data

US 2008/0059741 A1 Mar. 6, 2008

(51) Int. Cl.
*G06F 21/00* (2006.01)
(52) U.S. Cl. ............ 713/194; 726/34; 365/154; 257/922
(58) Field of Classification Search .................... 706/13, 706/26; 257/428, 59, 158, 499, 482, 642; 327/52; 348/262; 365/154, 185, 189; 712/32; 324/158; 380/52; 713/194; 726/36
See application file for complete search history.

(56) References Cited

U.S. PATENT DOCUMENTS

| | | | |
|---|---|---|---|
| 4,049,956 A | 9/1977 | Van Veen | |
| 4,360,915 A | 11/1982 | Sindelar | |
| 4,618,954 A | 10/1986 | Otobe et al. | |
| 4,710,842 A * | 12/1987 | Suzuki et al. | 361/88 |
| 4,811,294 A | 3/1989 | Kobayashi et al. | |
| 4,910,707 A | 3/1990 | Schrenk | |
| 5,053,992 A * | 10/1991 | Gilberg et al. | 365/185.04 |
| 5,084,843 A | 1/1992 | Mitsuishi et al. | |
| 5,084,872 A | 1/1992 | Houston | |
| 5,107,139 A | 4/1992 | Houston | |
| 5,159,629 A * | 10/1992 | Double et al. | 713/194 |
| 5,389,738 A * | 2/1995 | Piosenka et al. | 174/528 |
| 5,428,569 A | 6/1995 | Kato et al. | |
| 5,533,123 A * | 7/1996 | Force et al. | 713/189 |
| 5,544,098 A | 8/1996 | Matsuo et al. | |
| 5,606,532 A | 2/1997 | Lambrache et al. | |
| 5,708,414 A * | 1/1998 | Peltier et al. | 340/506 |

(Continued)

FOREIGN PATENT DOCUMENTS

DE 42 05 352 9/1992

(Continued)

OTHER PUBLICATIONS

PCT International Search Report and Written Opinion from PCT Application PCT/US2007/077715, mailed Mar. 11, 2008 (11 pages).

(Continued)

*Primary Examiner* — Nathan Flynn
*Assistant Examiner* — Michael R Vaughan
(74) *Attorney, Agent, or Firm* — Panitch Schwarze Belisario & Nadel LLP

(57) ABSTRACT

In a device having a plurality of circuits that can store at least a first value and a second value, a method can include configuring at least one circuit to persistently store the first value; determining whether the at least one circuit is storing the second value; and initiating a countermeasure if the at least one circuit is storing the second value. Determining whether the at least one circuit is storing the second value can include detecting whether the device has been attacked. Non-limiting examples of initiating a countermeasure can include resetting a portion of the device, powering down a portion of the device, activating an alarm circuit, causing protected data stored in the device to be erased, causing portions of the device to self-destruct, or causing the device to not respond to input applied to the interface.

13 Claims, 4 Drawing Sheets

U.S. PATENT DOCUMENTS

| | | | | |
|---|---|---|---|---|
| 5,712,973 | A | * | 1/1998 | Dayan et al. .................... 726/36 |
| 5,736,777 | A | * | 4/1998 | Shield et al. .................. 257/529 |
| 5,796,148 | A | * | 8/1998 | Gorman ........................ 257/379 |
| 5,898,711 | A | * | 4/1999 | Buer ............................ 714/800 |
| 5,991,519 | A | | 11/1999 | Benhammou et al. |
| 6,157,035 | A | * | 12/2000 | Kuijk et al. ............. 250/370.14 |
| 6,204,701 | B1 | | 3/2001 | Tsay et al. |
| 6,236,393 | B1 | | 5/2001 | Ogawa |
| 6,249,456 | B1 | * | 6/2001 | Chehadi .................... 365/185.2 |
| 6,331,946 | B1 | | 12/2001 | Silverbrook et al. |
| 6,346,835 | B1 | | 2/2002 | Ozeki et al. |
| 6,366,481 | B1 | | 4/2002 | Balakrishnan et al. |
| 6,377,086 | B1 | | 4/2002 | Bays et al. |
| 6,414,318 | B1 | * | 7/2002 | Uber et al. .................... 250/389 |
| 6,553,496 | B1 | * | 4/2003 | Buer .............................. 726/34 |
| 6,654,884 | B2 | | 11/2003 | Jaffe et al. |
| 6,665,161 | B1 | * | 12/2003 | Brady et al. .................... 361/78 |
| 6,801,060 | B2 | | 10/2004 | Ikehashi et al. |
| 6,834,331 | B1 | | 12/2004 | Liu |
| 6,868,009 | B1 | | 3/2005 | Hung et al. |
| 6,873,706 | B1 | | 3/2005 | Miyazaki et al. |
| 6,969,859 | B2 | * | 11/2005 | Klaasen et al. .......... 250/370.01 |
| 6,970,385 | B2 | | 11/2005 | Sakakibara |
| 6,998,670 | B2 | | 2/2006 | Lojek |
| 7,068,063 | B2 | | 6/2006 | Seike |
| 7,142,400 | B1 | | 11/2006 | Williams et al. |
| 7,159,153 | B2 | * | 1/2007 | Kim ................................ 714/48 |
| 7,193,430 | B2 | | 3/2007 | Ookawa |
| 7,295,046 | B2 | | 11/2007 | Chan et al. |
| 7,348,836 | B1 | | 3/2008 | Velmurugan |
| 7,503,501 | B2 | * | 3/2009 | Jeong ............................ 235/487 |
| 7,836,516 | B2 | * | 11/2010 | Stidl et al. ........................ 726/34 |
| 2004/0078589 | A1 | * | 4/2004 | Giraud ............................ 713/200 |
| 2004/0080999 | A1 | * | 4/2004 | Madurawe .................... 365/200 |
| 2004/0139340 | A1 | | 7/2004 | Johnson et al. |
| 2004/0140892 | A1 | * | 7/2004 | Hanood ........................ 340/511 |
| 2004/0237001 | A1 | | 11/2004 | Schulz et al. |
| 2005/0029460 | A1 | * | 2/2005 | Iwatschenko-Borho et al. ............. 250/359.1 |
| 2005/0235179 | A1 | | 10/2005 | Pistoulet |
| 2005/0236683 | A1 | * | 10/2005 | Shapiro et al. ................ 257/428 |
| 2005/0246600 | A1 | | 11/2005 | Pistoulet |
| 2005/0283566 | A1 | | 12/2005 | Callaghan |
| 2006/0041708 | A1 | * | 2/2006 | Kunemund .................... 711/100 |
| 2006/0098814 | A1 | | 5/2006 | Al-Khoraidly et al. |
| 2006/0136751 | A1 | * | 6/2006 | Bonaccio et al. ............. 713/194 |
| 2006/0192681 | A1 | * | 8/2006 | Haider et al. ................. 340/661 |
| 2007/0075251 | A1 | * | 4/2007 | Doughty et al. ......... 250/370.01 |
| 2007/0182575 | A1 | * | 8/2007 | Kunemund .................... 340/635 |
| 2008/0061843 | A1 | | 3/2008 | Yanci |
| 2008/0235796 | A1 | * | 9/2008 | Buhr .............................. 726/22 |
| 2009/0327633 | A1 | * | 12/2009 | Fusella et al. ................. 711/163 |

FOREIGN PATENT DOCUMENTS

| | | |
|---|---|---|
| EP | 0 874 369 A | 10/1998 |
| EP | 1 014 617 | 6/2000 |
| EP | 1 098 471 | 5/2001 |
| EP | 1 107 502 | 6/2001 |
| EP | 1 217 783 | 6/2002 |
| EP | 1 496 641 | 1/2005 |
| EP | 1 601 132 | 11/2005 |
| WO | WO 00/67410 | 11/2000 |
| WO | WO 01/55821 | 8/2001 |
| WO | WO 01/61914 | 8/2001 |
| WO | WO 01/61915 | 8/2001 |
| WO | WO 01/61916 | 8/2001 |
| WO | WO 2004/112306 | 12/2004 |
| WO | WO 2006095281 A1 * | 9/2006 |
| WO | WO 2007000701 A2 * | 1/2007 |
| WO | WO 2007020567 A1 * | 2/2007 |

OTHER PUBLICATIONS

International Search Report & Written Opinion, PCT/US2007/077112, mailed Apr. 25, 2008, 16 pages.

Computer Laboratory, University of Cambridge "Improving Smart Card Security Using Self-Timed Circuits" http://doi.ieeecomputersociety.org/10.1109/ASYNC.2002.1000311, 2002, 8 pages.

School of EECE, University of Newcastle Upon Tyne "Power-Balanced Self Checking Circuits for Cryptographic Chips", http://doi.ieeecomputersociety.org/10.1109/IOLTS.2005.56, 2005, 6 pages.

Department of Electrical and Computer Engineering, Boston University "Robust Protection against Fault-Injection Attacks on Smart Cards Implementing the Advanced Encryption Standard" http://doi.ieeecomputersociety.org/10.1109/DSN.2004.1311880, 2004, 9 pages.

Mehdi-Laurent Akkar "Automatic Integration of Counter-Measures Against Fault Injection Attacks" http://www.labri.fr/perso/ly/publications/cfed.pdf, 2003, 13 pages.

Li, Huiyun, "Security evaluation at design time for cryptographic hardware," Technical Report No. 665, University of Cambridge Computer Laboratory, Document UCAM-CL-TR-665/ISSN 1476-2986, Apr. 2006, 79 pages.

Kommerling and Kuhn, "Design Principles for Tamper-Resistant Smartcard Processors" USENIX Workshop on Smartcard Technology, Chicago, Illinois USA, May 10-11, 1999, 13 pages.

Bar-El, et al. "The Sorcerer's Apprentice Guide to Fault Attacks" IEEE Xplore, Feb. 2006, vol. 94, Issue 2, pp. 370-382, 13 pages.

"G3 Card IST-1999-13515 Public Final Report" Jan. 2003, 33 pages.

Naccache, "Finding Faults," CryptoCorner—IEEE Security & Privacy, IEEE Computer Society, Sep./Oct. 2005, pp. 61-65, 5 pages.

Neve, et al., "Memories: a Survey of their Secure Uses in Smart Cards," Proceedings of the 2$^{nd}$ IEEE International Security in Storage Workshop, 2004, 11 pages.

Philips "P5CC036 Secure PKI Smart Card Controller—Short Form Specification" Mar. 26, 2004, 9 pages.

Rankl, "Overview about Attacks on Smart Cards" 3$^{rd}$ Edition of Smart Card Handbook Sep. 2003, 16 pages.

Ravi et al. "Tamper Resistance Mechanisms for Secure Embedded Systems" Proceedings of the 17$^{th}$ International Conference on VLSI Design (VLSID '04) IEEE Computer Society, 2004, 7 pages.

Skorobogatov and Anderson, "Optical Fault Induction Attacks" University of Cambridge, Computer Laboratory, Springer-Verlag Berlin Heidelberg 2003, pp. 2-12, 11 pages.

TNO ITSEF BV Functionally Testing of Smart Cards http://www.itsef.com/level3/ftsc.htrn, 2006, 2 pages.

International Search Report & Written Opinion, PCT/US2007/060628, mailed May 5, 2008, 13 page.

U.S. Appl. No. 11/516,846, filed Sep. 7, 2006, Fusella et al.

\* cited by examiner

DETECTING RADIATION-BASED ATTACKS

TECHNICAL FIELD

The disclosed implementations relate to electrical circuits.

BACKGROUND

Secure integrated circuit cards, commonly referred to as smart cards, may be of the form of an embedded integrated circuit hardware device that is small enough to fit into a user's pocket. Secure integrated circuit cards can be used in many situations where critical information must be stored and shared. For example, set-top boxes that facilitate pay-per-view or video-on-demand features can use a secure integrated circuit card to supply user account information to a provider along with a request for access to such features, and to subsequently decrypt encrypted digital video streams that may be provided in response to the request. As another example, a Subscriber Identity Module (SIM) card in a Global Systems for Mobile Communications (GSM) phone can be used to store a user's personal information, such as his or her phone book, device preferences, preferred network(s), saved text or voice messages and service provider information. A SIM card can allow a user, for example, to change handsets while retaining all of his or her information on the SIM card. Smart cards can be used in a variety of applications (e.g., electronic payment systems, including specialized auto-debit devices such as public transportation cards and personal identification documents, such as passports, drivers licenses, and medical identification cards).

Because of the potential value of protected data stored in a smart card, hackers may employ various techniques to access or corrupt the protected data. For example, a hacker may grind off a portion of the smart card packaging in order to access internal signals and bypass security measures that may be in place. As another example, a hacker may subject the smart card to various kinds of radiation (e.g., laser light directed to exposed internal circuits or x-ray or gamma radiation directed through packaging) in an attempt to corrupt protected data. In some implementations, corruption of protected data at certain locations in the device can cause the device to bypass security measures (e.g., encryption algorithms) or to yield information to the hacker regarding device architecture or the protected data itself.

SUMMARY

In one implementation, a countermeasure (e.g., in the form of systems and methods) to a radiation-based attack of a device is provided. The countermeasure employs a first group of circuits to implement a function and employs a second group of circuits that are not used to implement the function. The countermeasure includes configuring the second group of circuits to store a first value, and monitoring the stored value to determine if the stored value is different than the first value. If the stored value is different than the first value, a radiation-based attack of the device may have occurred, and a protective action can initiated to secure the device.

In some implementations, in a device having a plurality of circuits that can store at least a first value and a second value, a method includes configuring at least one circuit to persistently store the first value; determining whether the at least one circuit is storing the second value; and initiating a countermeasure if the at least one circuit is storing the second value. The device can be a secure semiconductor device. The at least one circuit can include an unused gate in a design. In some implementations, the at least one circuit is determined as unused after a layout operation. The at least one circuit can be a memory cell that is configured to store a value. Determining whether the at least one circuit is storing the second value can include detecting whether the device has been attacked.

Initiating a countermeasure can include resetting a portion of the device, powering down a portion of the device or activating an alarm circuit. Activating an alarm circuit can include asserting an interrupt signal or setting an alarm register value. Initiating a countermeasure can include preventing data that is stored inside the device from being provided to an interface of the device, preventing data received at the interface from being stored in the device, closing a communication channel associated with the device, or causing the device to not respond to input applied to the interface. Initiating a countermeasure can include causing protected data stored in the device to be erased or causing portions of the device to self-destruct. Causing portions of the device to self-destruct can include applying a voltage or current to an electrically closed internal trace or fuse, the voltage or current being sufficient to cause the internal trace or fuse to have an electrically open state following application of the voltage or current.

In some implementations, a device includes a plurality of standard logic cells; a first plurality of circuits that implements a function and that comprises a portion of the plurality of standard logic cells; a second plurality of circuits that comprises unused portions of the plurality of standard logic cells, wherein each circuit in the second plurality of circuits is adapted to store either a first value or a second value and is configured to persistently store the first value; and a detection circuit that determines whether at least one of the circuits in the second plurality of circuits is storing the second value.

In some implementations, the device is a semiconductor device, and the circuits in the second plurality of circuits are distributed across a portion of a surface of the semiconductor device. The device can further include a countermeasure circuit that initiates a protective measure when the detection circuit determines that at least one of the circuits in the second plurality of circuits is storing the second value. The protective measure can include resetting the device or powering off the device.

In some implementations, the portions of the standard logic cells in the second plurality of circuits are adapted to have substantially identical sensitivity to voltage glitches as corresponding portions of the standard logic cells in the first plurality of circuits. In some implementations, the portions of standard logic cells in the second plurality of circuits are adapted to have substantially identical sensitivity to radiation as corresponding portions of the standard logic cells in the first plurality of circuits. Sensitivity to radiation can include sensitivity to a laser-based attack. Sensitivity to radiation can include sensitivity to x rays or gamma rays.

In some implementations, a circuit includes a) a plurality of flip-flops, each flip-flop having a clock input, a data input, and an output and being adapted to propagate a logic value from the data input to the output on an edge of a signal coupled to the clock input, each data input and clock input being coupled to a signal that represents a first logic state; and b) an evaluation circuit whose inputs couple to outputs of each flip-flop in the plurality of flip-flops and whose output is coupled to a countermeasure circuit, the evaluation circuit having an initial output at a first state when a respective input of the evaluation circuit receives a respective signal representing the first logic state from a respective one of the plurality of flip-flops, and producing an output at a second state when any input of the evaluation circuit receives a signal that is not representative of the first logic state. The countermeasure circuit can be configured to initiate protective action upon receiving an input at the second state from the evaluation circuit. In some implementations, each flip-flop has an asynchronous clear signal that is configured to clear the flip-flop upon a reset event.

In some implementations—in a semiconductor device having a plurality of standard logic cells, a first set of circuits that comprises a portion of the plurality of standard logic cells and that is adapted to implement a function, and a second set of circuits that comprises unused portions of the plurality of standard logic cells, wherein each circuit in the second set is adapted to store either a first value or a second value—a method of protecting the semiconductor device from attacks includes a) configuring each circuit in the second set to persistently store the first value; b) determining whether any circuit in the second set is storing the second value; and c) initiating a countermeasure if it is determined that any circuit in the second set is storing the second value.

Determining whether any circuit in the second set is storing the second value can include detecting a radiation-based attack. Detecting a radiation-based attacked can include detecting a change in a value, from the first value to the second value, stored by any circuit in the second set. Initiating a countermeasure can include resetting at least a portion of the semiconductor device.

The details of one or more implementations are set forth in the accompanying drawings and the description below. Other features, objects, and advantages will be apparent from the description and drawings, and from the claims.

DESCRIPTION OF DRAWINGS

Like reference symbols in the various drawings indicate like elements.

DETAILED DESCRIPTION

Figure 1:
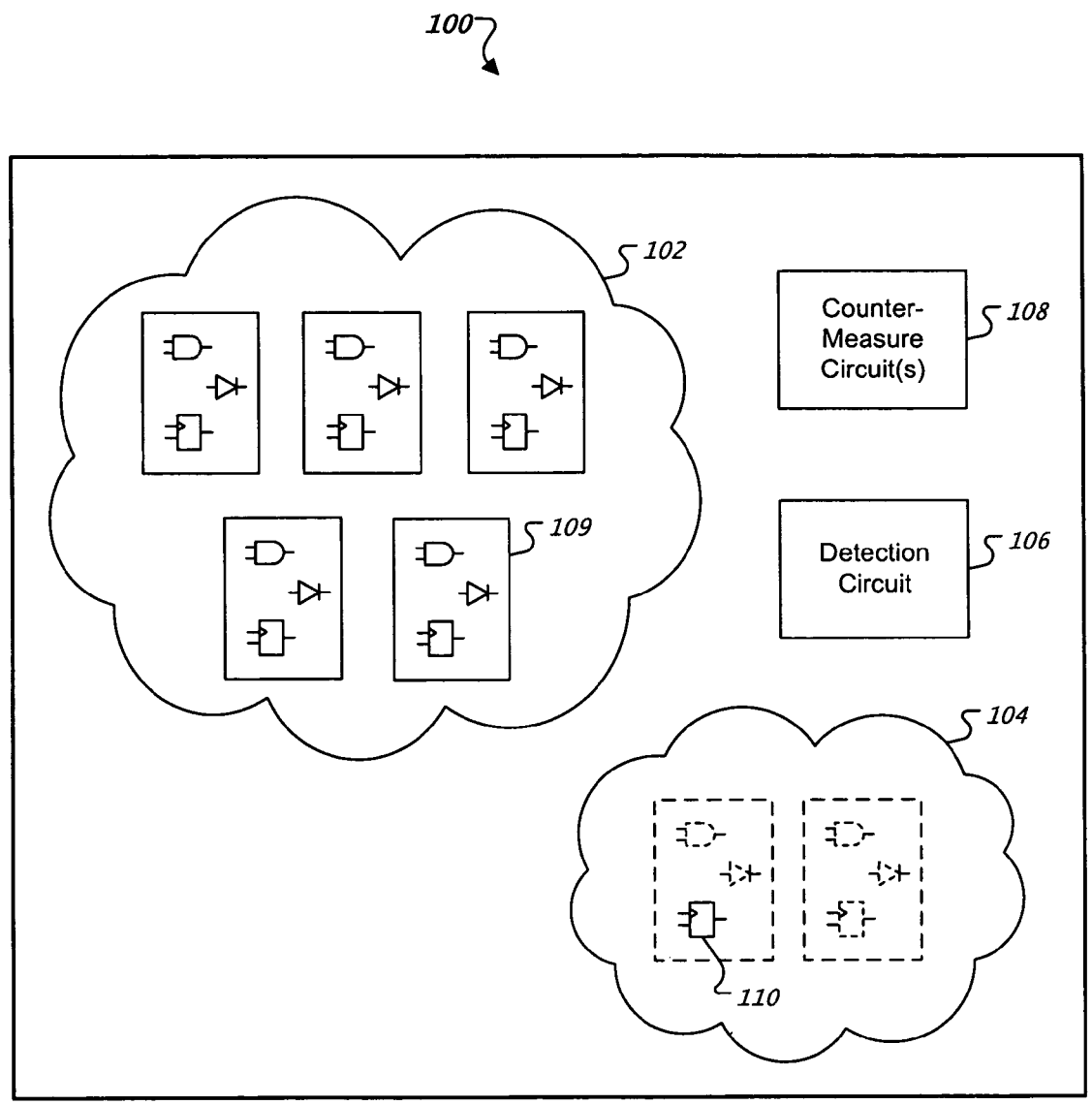
FIG. 1 is a block diagram of an exemplary device that can detect radiation-based attacks.

FIG. 1 is a block diagram of a device 100 that can detect possible attacks (e.g., radiation-based attacks, voltage glitch attacks, etc.) aimed at accessing or corrupting data stored in or processed by the device 100. The device has a first group of circuits 102, which implements a function, and a second group of circuits 104, which are not used to implement the function. In some implementations, the device is a secure integrated circuit device (e.g., a smart card) that stores or processes protected data, and the function implemented by the first group of circuits 102 relates to storing or processing the protected data; other example devices and functions are provided below. To counteract a possible hacker's attempts to access or corrupt the protected data stored on or processed by the device 100, the device 100 employs the second group of circuits 104, in conjunction with a detection circuit 106, to detect attempts to access or corrupt the protected data. In one particular implementation, the device 100 can detect radiation-based attacks such as laser, x-ray or gamma ray attacks. The device 100 also includes a countermeasure circuit 108 that protects the device 100 upon detection of an attack (e.g., a radiation-based attack). Protecting the device can include, for example, resetting or powering down portions of the device 100 in order to prevent data stored in the device 100 from being corrupted or in order to prevent security of the device from being breached.

In some implementations, the first group of circuits 102 and second group of circuits 104 include "standard" logic cells or elements, such as a logic cell 109. As shown, each standard logic cell (e.g., logic cell 109) includes certain standard resources, such as, for example, logic gates; memory elements (e.g., flip-flops); multiplexers; various interconnections for forming data paths; clock, reset, or other global signals; etc. Aspects of the cells can be standardized, for example, to facilitate efficient production of FPGA devices (field programmable gate array devices), PLDs (programmable logic devices) or ASIC devices (applications specific integrated circuits). By using standard logic cells in an FPGA, PLD or ASIC design, a hardware designer can take advantage of known electrical characteristics (e.g., propagation delays, capacitance, inductance, etc.) to reduce design times.

In some implementations, the standard logic cells are included in configurable logic blocks (CLBS) that, along with configurable routing channels, are included in an FPGA or PLD device. Various components of the CLBs can be selectively coupled together with the configurable routing channels to provide specific hardware functions that, for example, have been designed in a hardware description language or with a schematic capture tool, placed and routed within a specific FPGA or PLD architecture, and loaded into the FPGA or PLD device during a configuration process. In other implementations, the standard logic cells are included in design libraries of particular ASIC devices. Like CLBs in an FPGA or PLD device, the standard logic cells in an ASIC design library can be ultimately coupled together with various routing channels to provide specific hardware functions; however, ASIC devices are generally not as configurable as FPGA or PLD devices. The specific hardware functions implemented in ASIC devices can also be designed in a hardware description language or a schematic capture tool, simulated, placed and routed, and the design can be fabricated in a semiconductor fabrication process.

Whether implemented in FPGAs, PLDs, ASICs, or other devices, multiple standard logic cells in the first group of circuits 102 can be combined to perform complex operations (e.g., one or more functions). In some implementations, the standard logic cells are combined to store and process protected data. For example, the standard logic cells can be combined to form at least part of a secure memory for storing protected data. As another example, the standard logic cells can be combined to form at least part of a hardware encryption or decryption engine for securing protected data. As another example, the standard logic cells can be combined to form at least part of a secure access control or payment mechanism that stores protected identification information, such as a smart card, banking card or Subscriber Identity Module (SIM) card.

A hacker may attempt to access or corrupt the protected data that is stored or processed by the device 100 using a variety of different invasive or non-invasive attacks. In particular, the hacker may employ a radiation-based attack during which the hacker directs a beam of radiation (e.g. a laser beam, x-ray, gamma ray, etc.) at the first group of circuits (e.g., at an element of a standard logic cell) that is susceptible to being affected by such radiation; the element may have been previously exposed (e.g., by the hacker grinding off packaging material that protects the element), or the radiation may be able to penetrate intact packaging. In some implementations, radiation interferes with semiconductor devices at the transistor level, for example, by injecting charges or internal currents that disrupt the normal operation of the devices. Register structures within semiconductor devices can be particularly sensitive to such disruptions. As a more specific example, some flip-flops, when subjected to certain radiation, can latch and output values that are independent of the values on their inputs. Thus, in some implementations, a hacker can use radiation to modify digital values stored within a flip-flop or other circuit.

Modification of particular digital values by an invasive or noninvasive attack can cause the normal operation of the device 100 to be altered. For example, if device 100 employs the first group of circuits 102 to implement an encryption or security algorithm, the encryption or security algorithm can be affected or compromised if a bit is unexpectedly changed within, for example, logic cell 109 (e.g., by an external radiation source). By repeatedly directing radiation at the logic cell 109 (or to other logic cells) during the operation of the device 100, a hacker can, in some instances, cause the device 100 to completely bypass a security algorithm; in other instances, the hacker can obtain information about the operation of the device 100 that enables the hacker to subsequently crack a corresponding security algorithm in another manner (e.g., the hacker may be able to obtain a key value, which can be subsequently used to access protected information in a manner that is determined by the device to be "authorized"). A vulnerability in the device 100 that allows hackers to modify particular digital values within the device 100 using an invasive or noninvasive attack can also impact the marketability of the device 100 as a "secure device." Accordingly, it can be advantageous to detect events that are likely to be attacks of the device.

To detect events that are likely to be attacks, the device 100 employs the second group of circuits 104—which has a similar susceptibility to attack (e.g., to radiation) as the first group of circuits 102—in conjunction with the detection circuit 106. In some implementations, the second group of circuits 104 also includes standard logic cells, or portions of standard logic cells, including a memory element 110. Alternatively, the second group of circuits 104 can include other standard elements (not shown) that are common to the first group of circuits 102 in architecture and function. Because the second group of circuits 104 has a similar susceptibility to attack as the first group of circuits 102, the second group of circuits 104 detects, in some implementations, an attack that can compromise the security of the first group of circuits 102. Upon detecting such an attack, the detection circuit 106 can trigger a countermeasure circuit 108 that initiates a protective countermeasure to maintain the security of the device 100. As described above, example countermeasures can include resetting or powering down portions of the device. A specific example of the second group of circuits 104 (also referred to below as "circuit 104") is now illustrated and described with reference to FIG. 2.

Figure 2:
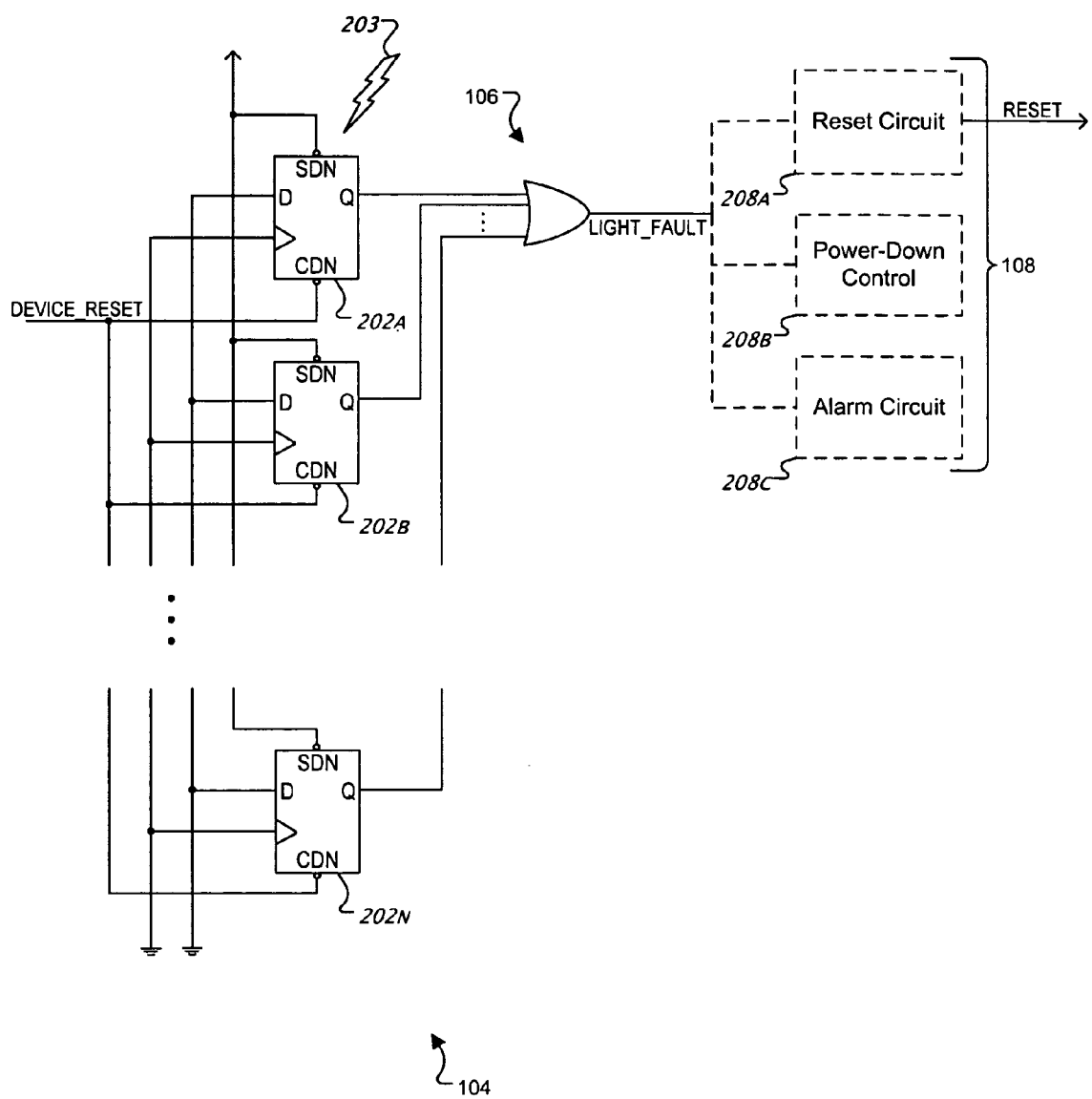
FIG. 2 is a schematic diagram showing example circuits that can be employed to detect a radiation-based attack.

FIG. 2 is a schematic diagram showing an example circuit 104 that can be used to detect a possible attack (e.g., radiation-based attack). In FIG. 2, the circuit 104 includes memory elements (e.g., D flip-flops) 202A, 202B and 202N that are configured to persistently store a first value (e.g., a logic one) or a second value (e.g., a logic zero); as shown (note that each data and clock input is tied to ground), the memory elements 202A, 202B and 202N are all configured to persistently store a logic zero (an "expected value"). The detection circuit 106 (e.g., an OR gate) is coupled to the memory elements 202A, 202B and 202N and detects whether any of the memory elements 202A, 202B or 202N are currently storing a logic one.

During normal operation, since the memory elements are configured to persistently store a known state (e.g., a logic zero), none of the memory elements will have at its output a different state (e.g., a logic one), and the detection circuit 106 will accordingly have a known output state (e.g., not output a logic one). However, if one of the memory elements (e.g., flip-flop 202A) is subjected to certain kinds of attacks (e.g., radiation attacks (schematically depicted by lightning bolt 203)), that memory element can latch and output a new value (e.g., a logic one), and the detection circuit 106 can detect this new value and flag the detection at its output (e.g., by outputting a logic one or other appropriate value on the net labeled "LIGHT_FAULT" in FIG. 2). Thus, the detection circuit 106, in conjunction with the memory elements 202A, 202B and 202N can, in some implementations, detect radiation-based attacks.

As further depicted in FIG. 2, detection of a possible attack can trigger one or more countermeasure circuits 108. For example, assertion of the LIGHT_FAULT signal can trigger a reset circuit 208A that asserts a RESET signal to one or more portions of the device 100. The RESET signal can cause a currently-pending operation (e.g., a data-retrieval, data-storage operation or data-processing operation) to be ignored and can further cause the device 100 to be returned to an initial power-on state. As another example, assertion of the LIGHT_FAULT signal can trigger a power down-control circuit 208B that powers down at least a portion of the device 100. As another example, assertion of the LIGHT_FAULT signal can trigger an alarm circuit 208C that can indicate to another hardware device or to a software program being executed by the device 100 (or by another device) that a possible attack has occurred; as a more specific example, the alarm circuit 208C can include a register (not shown) that is set with a particular value upon assertion of the LIGHT_FAULT signal, and a software program (not shown) can periodically read the register; as another specific example, the alarm circuit 208C can trigger an interrupt to a controller or microprocessor (not shown) that works in conjunction with the device 100.

Other countermeasure circuits (not shown) can also be triggered. For example, in some implementations, countermeasure circuits can prevent read data from being provided to an output interface of the device 100; countermeasure circuits can prevent write data from being stored in the device 100; countermeasure circuits can cause the device to "freeze" and not respond to external inputs; countermeasure circuits can cause protected data to be erased; countermeasure circuits can cause communication channels (not shown) of the device 100 to be closed; countermeasure circuits can cause portions of the device 100 to self-destruct to secure protected data (e.g., a countermeasure circuit can subject certain electrically closed internal traces or fuses to short voltages or currents that cause the traces to become electrically open (e.g., melt), irreversibly preventing the device 100 from providing stored data to external circuitry); or countermeasure circuits can initiate other actions or cause other results.

In some implementations, multiple countermeasure circuits can be triggered in sequence or parallel. For example, some implementations include a counter (not shown) that tracks a number of times the LIGHT_FAULT signal is asserted. The first time the LIGHT_FAULT signal is asserted, the reset circuit 208A can be triggered to reset a portion of the device 100; the second time the LIGHT_FAULT signal is asserted, the power-down control 208B can be triggered to power down a portion of the device 100; the third time the LIGHT_FAULT signal is asserted, a circuit (not shown) that causes a portion of the device 100 to self-destruct can be activated, irreversibly altering the device 100 and securing protected data stored in or processed by the device 100. In some implementations, different countermeasure circuits can be triggered based on a specific location within the device 100 that an attack is detected. For example, more drastic countermeasures can be initiated if the attack is detected in areas of the device 100 that store or process protected data, whereas less drastic countermeasures can be initiated if an attack is detected in areas of the device 100 that do not directly store or process protected data.

In some implementations, the detection circuit 106 only asserts the LIGHT_FAULT signal if more than one memory element 202A, 202B or 202N has a value other than the expected value. For example, in some implementations, the detection circuit requires unexpected values from at least two memory elements 202A, 202B or 202N before asserting the LIGHT_FAULT signal. In particular, the detection circuit 106 can include more complicated circuitry than a single OR gate; moreover, some implementations of the detection circuit 106 include a counter (not shown) that must reach a predetermined value before the LIGHT_FAULT signal is asserted. In this manner, sensitivity of the detection circuit 106 can be "tuned" based on various environmental or process parameters. For example, in very noisy environments, occasional glitches in the memory element 202A may be anticipated. By requiring multiple unexpected values from the memory elements 202A, 202A or 202N, "false-positive" initiations of a countermeasure circuit 108 can be avoided, but by triggering the LIGHT_FAULT signal after a predetermined number of unexpected values from the memory elements 202A, 202B and 202N, the device 100 can still be protected from true attacks.

As shown in FIG. 2, in one implementation, each memory device 202A, 202B and 202N is cleared whenever the device is reset; in particular, a "clear" input ("CDN") is tied to a DEVICE_RESET signal, such that when the device 100 is reset (e.g., during initial power-up), the second group of circuits 104 is properly initialized. In other implementations, the memory devices 202A, 202B, and 202N, and/or the detection circuit 106 (and/or countermeasure circuit(s) 108) are reset in other manners. For example, in some implementations, reading a register associated with an alarm circuit 208C can reset at least one of the second group of circuits 104; the memory devices 202A, 202B and 202N; the detection circuit 106; or the countermeasure circuit(s) 108.

Figure 3:
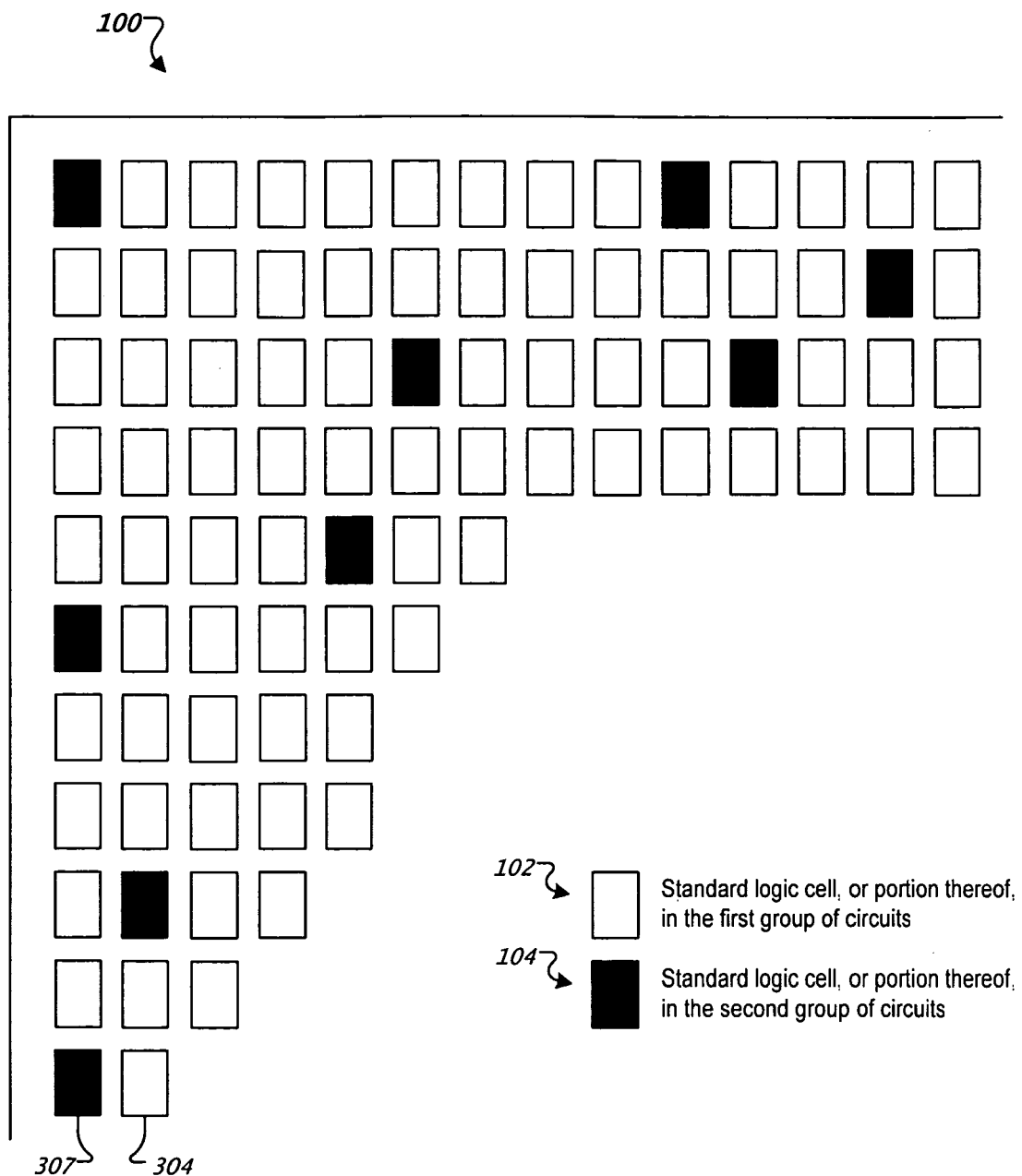
FIG. 3 illustrates one example distribution of detection circuits in a device.

A few example detection and countermeasure circuits are illustrated and described with reference to FIG. 2, but other implementations are possible and contemplated. In general, any circuit that is susceptible to attack (e.g., to a radiation-based attack) can be used to detect a possible attack, and any number of such circuits can be combined to provide detection across a large area of the surface of the device 100. For example, FIG. 3 illustrates one way a number of memory elements can be distributed across the device 100 to detect possible attacks. Moreover, as described above, the detection circuit can be combined with one or more countermeasure circuits to secure protected data stored or processed by the device 100.

FIG. 3 illustrates one example distribution of detection circuits that can be employed to detect possible attacks in order to secure protected data stored or processed by the device 100. As shown, the device 100 includes a number of standard logic cells, such as the logic cell 304, that are included in the first group of circuits 102 (depicted as unshaded boxes, and referred to hereafter as "function cells"); the device also includes a number of standard logic cells, such as the logic cell 307, that are included in the second group of circuits 104 (depicted as shaded boxes, and referred to hereafter as "detection cells"). (As used in this document, "standard logic cell" should be understood to also include portions of a standard logic cell or individual standard logic elements.) In some implementations, the function cells and the detection cells have similar susceptibility to attacks (e.g., radiation-based attacks), as described above; that is, certain logic cell elements (e.g., memory elements) in both function cells and detection cells are susceptible to having stored values changed unexpectedly when the function cells or detection cells are subjected to certain kinds of attacks.

To protect a large portion of the device 100, the detection cells can be distributed across a substantial portion of the surface of the device 100. Accordingly, for example, radiation that is directed to function cells will likely impinge on one or more detection cells and the radiation can thereby be detected. For example, if a hacker directs radiation to the function cell 304 (e.g., in an attempt to access or corrupt data stored or processed by the device 100), the radiation will be likely to also impinge on the detection cell 307. If enough detection cells are included, radiation that impinges on any portion of the device 100 can be detected. For example, if a typical radiation-based attack involves focusing a laser beam on portions of the device 100, and if a typical laser beam generally affects a fixed number (e.g., 500) of function cells simultaneously, then by including at least one detection cell for substantially every fixed number (e.g., 500) of function cells and substantially uniformly distributing the detection cells across the surface of the device 100, a laser-based attack of any portion of the device 100 is likely to be detected.

Detection cells can be distributed across the surface of the device 100 in a number of ways. For example, in some implementations, the detection cells are placed and routed in a regular pattern (e.g., a checkerboard pattern (not shown)) along with the function cells. As another example, a number of detection cells are randomly distributed across the device 100; in particular, for instance, a number (e.g., one hundred) detection cells can be randomly placed across the device 100. As another example, one detection cell can be placed with each group of a certain number of function cells; in particular, for instance, one detection cell can be included with substantially every twenty function cells, and the detection cell can be placed at a location that is convenient based on the placement and routing of the twenty function cells. As another example, all of the function cells can be placed and routed, and detection cells can be added around the placed and routed function cells. In some implementations, the detection cells are standard logic cells that are not used as function cells. As another example, critical portions of the device 100 can be placed and routed (e.g., portions of the device 100 most affecting security of data that is to be stored or processed by the device 100), and detection cells can be added in greater number around the critical portions.

In some implementations, "spare" standard logic cells are routed with function cells in order to provide a means to more easily debug, repair or enhance functionality (e.g., in case bugs arise in a final layout). That way, if, for example, after an ASIC is produced, it is determined that a circuit in the ASIC is not functioning properly, a nearby spare logic cell can be used to correct the functionality. If there are enough spare logic cells in the design, the change can be implemented, for example, with a small change to a metal interconnect layer, rather than by an entire redesign of the ASIC. In these implementations, the spare cells can be used as detection cells—unless and until they are subsequently needed to implement changes, at which point, detection functionality of that cell can be disconnected and the spare cell can be used to implement the changes.

Figure 4:
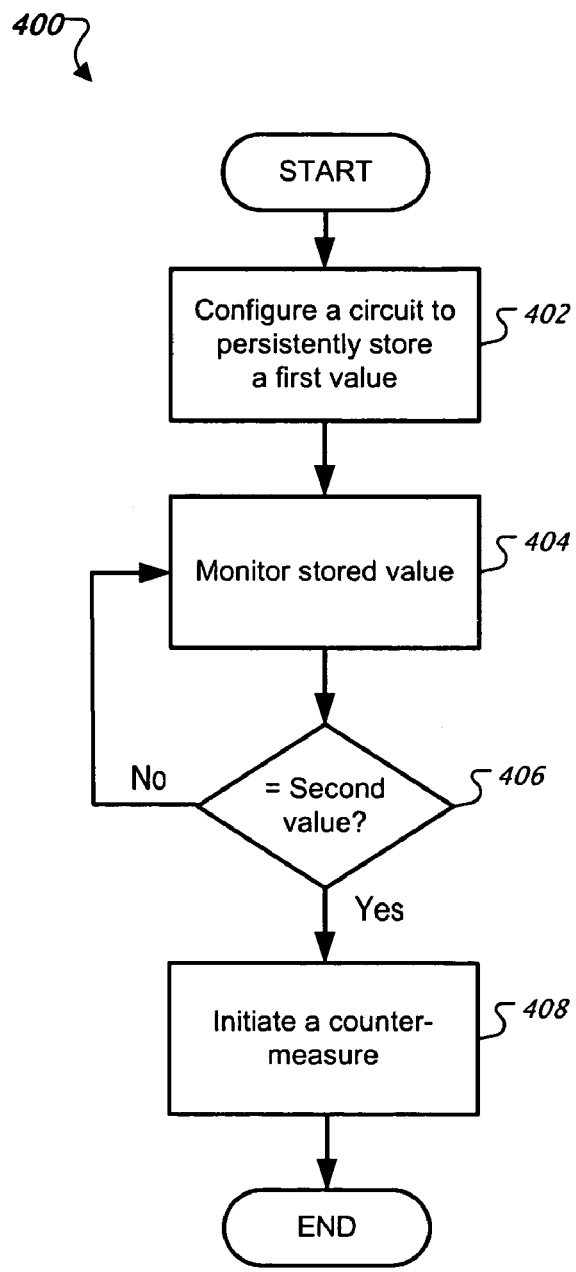
FIG. 4 is a flow diagram illustrating an example method of securing a device.

FIG. 4 is a flow diagram illustrating a method 400 of securing a device. For example, the method 400 can be used to secure protected data that is stored or processed within a memory device. As another example, the method 400 can be used to secure hardware that implements a protected function, such as an encryption or decryption algorithm. In some implementations, the method 400 is implemented in a device such as the device 100 that is illustrated in and described with reference to the previous figures.

The method 400 includes configuring (402) a circuit to persistently store a first value. For example, with reference to FIG. 2, the method 400 can include configuring the memory elements 202A, 202B and 202N (e.g., detection cells) to each persistently store a logic zero. As shown in FIG. 3, the detection cells can be numerous and distributed across the device 100.

The method 400 includes monitoring (404) the stored value, and determining (406) whether the stored value is equal to a second value. For example, the method 400 can include monitoring (404) outputs of the memory elements 202A, 202B and 202N with the detection circuit 106 to determine (406) whether any of the memory elements 202A, 202B or 202N currently have a logic one value.

If the monitored stored value(s) is (are) not equal to the second value, the method 400 includes continuing to monitor (404) the stored value(s). If the stored value is equal to the second value, then the method 400 includes initiating (408) a countermeasure. For example, the method 400 can include initiating a countermeasure 108 in response to assertion of the LIGHT_FAULT signal, which indicates that one or more of the memory elements 202A, 202B or 202N is currently storing an unexpected value—a possible indication of a radiation-based attack. In particular, initiating (408) a countermeasure can include, for example, triggering a reset circuit 208A, triggering a power-down control circuit 208B, triggering an alarm circuit 208C, or triggering some other countermeasure circuit 108.

A number of implementations have been described. Nevertheless, it will be understood that various modifications may be made without departing from the spirit and scope of the described implementations. For example, the techniques and methods described herein can be applied to FPGAs, PLDs, ASICs and other electrical circuits used to implement smart cards, banking cards, secure memory devices, SIM cards or used in other applications; countermeasures can be applied in many different ways or combinations of ways; detection cells can detect many different kinds of radiation, including, for example, visible light, infrared radiation, laser light, x-rays, or gamma rays; detection cells can be placed in a device in many different ways and may include cells that are not used to implement a function performed by the device; detection cells can detect attacks other than radiation-based attacks, such as, for example, voltage glitch attacks. Accordingly, other implementations are within the scope of the following claims.

What is claimed is:

1. A device comprising:
    a plurality of standard logic cells;
    a first plurality of circuits that implements a function and that comprises a portion of the plurality of standard logic cells;
    a second plurality of circuits that comprises portions of the plurality of standard logic cells that are not included in the first plurality of circuits that implements the function, wherein each circuit in the second plurality of circuits is adapted to store either a first value or a second value and is configured to persistently store the first value;
    a detection circuit that determines whether a plurality of the circuits in the second plurality of circuits is concurrently storing the second value including a tuning circuit comprising a counter that counts how many of the second plurality of circuits are storing the second value and a tunable threshold register that indicates a threshold number of the second circuits that can store the second value concurrently without triggering a countermeasure; and
    a countermeasure circuit that initiates a first protective measure when the detection circuit determines that a first number of the second plurality of circuits is storing the second value where the first number is greater than the threshold number, and a second protective measure, which is different than the first protective measure, when the detection circuit determines that a second different number of circuits in the second plurality of circuits is also coincidentally storing the second value where both the first and the second protective measures include one or more measures to protect the first plurality of circuits.

2. The device of claim 1, wherein the device is a semiconductor device, and the circuits in the second plurality of circuits are distributed across a portion of a surface of the semiconductor device.

3. The device of claim 1, wherein at least one of the first protective measure or the second protective measure comprises resetting the device or powering off the device.

4. The device of claim 1, wherein the portions of standard logic cells in the second plurality of circuits are adapted to have substantially identical sensitivity to radiation as corresponding portions of the standard logic cells in the first plurality of circuits.

5. The device of claim 4, wherein sensitivity to radiation comprises sensitivity to a laser-based attack.

6. The device of claim 4, wherein sensitivity to radiation comprises sensitivity to x-rays or gamma rays.

7. The device of claim 1, wherein the portions of the standard logic cells in the second plurality of circuits are adapted to have substantially identical sensitivity to voltage glitches as corresponding portions of the standard logic cells in the first plurality of circuits.

8. The device of claim 1, wherein the countermeasure circuit is configured to progressively initiate different protective measures, including a) initiating the first protective measure when the detection circuit determines that a threshold number of one or more of the second plurality of circuits is storing the second value, and b) initiating the second protective measure when the detection circuit determines that a number greater than the threshold number of the second plurality of circuits is storing the second value.

9. The device of claim 1, wherein the countermeasure circuit is configured to a) initiate the first protective measure when the detection circuit determines that a circuit in the second plurality of circuits at a first location of the device is storing the second value, and b) initiate the second protective measure when the detection circuit determines that a circuit in the second plurality of circuits at a second location of the device that is different than the first location is storing the second value.

10. A circuit comprising:
    a plurality of flip-flops, each flip-flop having a clock input, a data input, and an output and being adapted to propagate a logic value from the data input to the output on an edge of a signal coupled to the clock input, each data input and clock input being coupled to a signal that represents a first logic state; and an evaluation circuit whose inputs couple to outputs of each flip-flop in the plurality of flip-flops and whose one or more outputs are coupled to a countermeasure circuit, the evaluation circuit having an initial output at a first state when a respective input of the evaluation circuit receives a respective signal representing the first logic state from each respective one of the plurality of flip-flops, and producing an output at a second state when a plurality of inputs of the evaluation circuit receive a signal that is not representative of the first logic state;

a tuning circuit comprising a counter that counts how many of the flip-flops are concurrently storing a logic level at the second state and a tunable threshold register that indicates a threshold number of the flip-flops that can concurrently store the logic level at the second state without triggering a countermeasure, where the threshold number is equal to or greater than two;

the countermeasure circuit configured to a) initiate a first protective action upon receiving a first input from the tuning circuit and b) initiate a second protective action that is different than the first protective action upon receiving a second input from the tuning circuit where both the first and the second protective action include one or more measures to protect the first plurality of circuits.

11. The circuit of claim 10, wherein initiating the first protective action comprises asserting a reset signal to at least a portion of a device that includes the circuit.

12. The circuit of claim 10, wherein initiating the second protective action comprises asserting a power-down signal to at least a portion of a device that includes the circuit.

13. The circuit of claim 10, wherein each flip-flop has an asynchronous clear signal that is configured to clear the flip-flop upon a reset event.

\* \* \* \* \*